OSCILLATOR CONTROL FOR IMPROVING THE STRONG SIGNAL
HANDLING CAPABILITIES OF SIGNAL RECEIVERS

Filed Jan. 11, 1966

INVENTOR.
WILLIAM W. LANCASTER
BY
Fordyce A. Bothwell
ATTORNEY

United States Patent Office 3,457,514
Patented July 22, 1969

3,457,514

OSCILLATOR CONTROL FOR IMPROVING THE STRONG SIGNAL HANDLING CAPABILITIES OF SIGNAL RECEIVERS

William W. Lancaster, Philadelphia, Pa., assignor to Philco-Ford Corporation, a corporation of Delaware Filed Jan. 11, 1966, Ser. No. 519,934
Int. Cl. H04b *1/16*
U.S. Cl. 325—409 7 Claims

ABSTRACT OF THE DISCLOSURE

A heterodyne receiver having a feedback control circuit which varies the amplitude of the local-oscillator voltage of the receiver in direct relation to variations in the amplitude of the received signal. Such control of the local-oscillator voltage increases the capacity of the mixer of the receiver to convert without distortion high-amplitude received signals. In a specific embodiment the amplitude of the oscillator voltage is varied by decreasing the loading on the tank circuit of the oscillator as the amplitude of the received signal increases.

This invention relates to superheterodyne-type signal receivers employing a mixer and a local oscillator for conversion of a received RF signal to an IF signal. More particularly the invention relates to improvement of the strong signal handling capability of the mixer in such receivers. The invention is particularly applicable to improvement of the strong signal handling capability of a transistor mixer.

In the past, to improve the strong signal handling capabilities of transistor mixers, the practice has been to reduce the signal level reaching the mixer by diodes or bridge circuits. However I have found that the mixer signal handling capability can be improved some 15 to 20 db if the oscillator injection voltage is increased from its usual value of about .1 volt to about 1.5 volts.

One object of the present invention is to improve the strong signal handling capability of the mixer by increasing the amplitude of the oscillator voltage in direct relation to the strength of the received signal.

Another object of the invention is to control the amplitude of the oscillator voltage by means of the usual AGC voltage.

Figure 1:
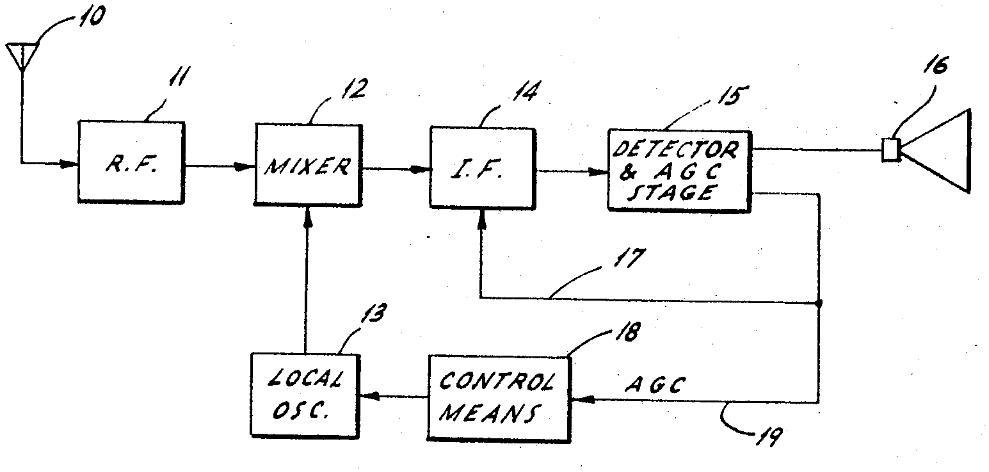
Figure 2:
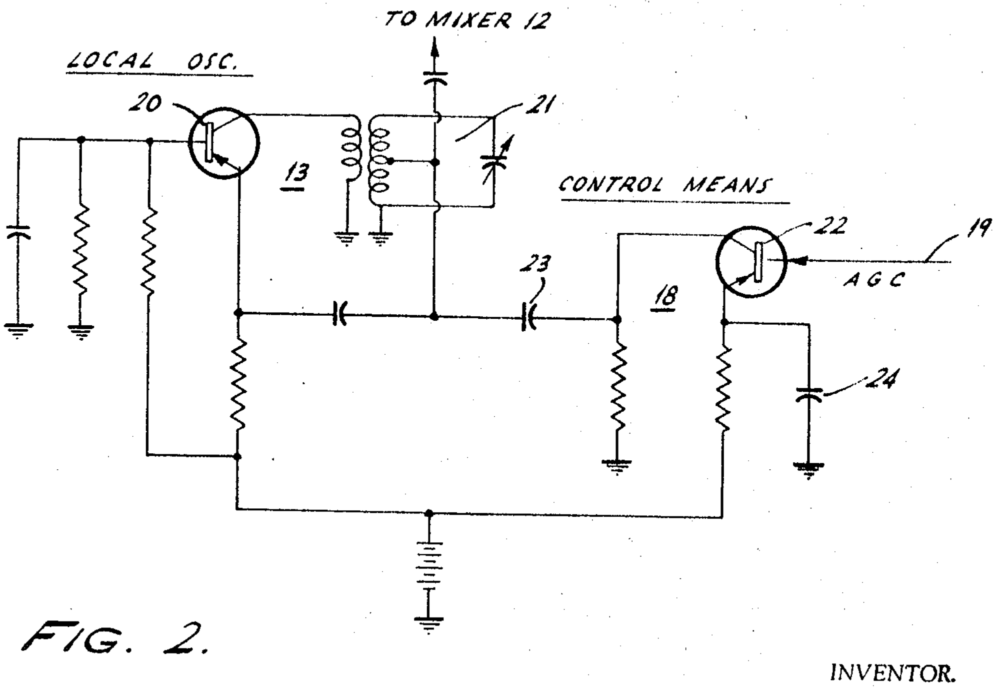

The invention may be fully understood from the following detailed description with reference to the accompanying drawing wherein FIG. 1 is a block diagram of a radio receiver embodying the present invention; and FIG. 2 is a schematic illustration of a preferred embodiment of the invention.

Referring first to FIG. 1, there is represented a superheterodyne radio receiver comprising antenna 10, RF section 11, mixer 12, local oscillator 13, IF section 14, detector and AGC stage 15, and loud speaker 16. All of said components are conventional except that the local oscillator is controlled according to the present invention as hereinafter described. Also conventional is the derivation of the AGC voltage from stage 15 and the application thereof to the IF section 14 via connection 17, it being understood that the AGC voltage can be applied to the RF section and/or the IF section. The AGC-controlled stage or stages may be of the character disclosed in copending Hopengarten and Lancaster application Ser. No. 364,635, filed May 4, 1964. By way of example it is assumed that the illustrated receiver employs p-n-p transistors in the various sections or stages thereof. Therefore the AGC voltage increases in the positive direction in response to increase in amplitude of the received signal.

As is well understood, in operation of such a receiver the oscillator 13 supplies a voltage to the mixer 12 to effect frequency conversion of the received RF signal to the IF frequency. In accordance with this invention, the strong signal handling capability of the mixer 12 is improved by varying the oscillator output signal amplitude in predetermined relation to the strength of the received signal. This is done by controlling the oscillator 13 through control means 18 to which the AGC voltage is supplied via connection 19.

Referring now to FIG. 2, there is shown a preferred embodiment of the control means 18 in association with the oscillator 13. The latter comprises a transistor 20, a tunable tank circuit 21, and the associated circuit components as illustrated. The oscillator output signal supplied to mixer 12 is derived from a center tap on the inductor of the tank circuit 21. The control means 18 comprises a transistor 22 whose collector is coupled to said center tap through capacitor 23 and whose emitter is coupled to ground through capacitor 24. The transistor 22 thus constitutes a variable load on said tank circuit, the magnitude of the load depending on the degree of conductivity of the transistor. The conductivity of transistor 22 is varied by the application of the AGC voltage from source 15 to its base by way of connection 19.

In operation, when the amplitude of the received signal is low the AGC voltage is low and transistor 22 is in saturation. Consequently the loading of the tank circuit 21 is high and the amplitude of the oscillator output signal applied to mixer 12 is low. When the amplitude of the received signal is high, the AGC voltage is high and the conductivity of transistor 22 is low. Hence the loading of the tank circuit 21 is low and the amplitude of the oscillator output signal supplied to mixer 12 is high.

Thus the loading of the tank circuit is varied in inverse relation to the amplitude of the received signal, and the amplitude of the oscillator output signal supplied to mixer 12 is varied in direct relation to the strength of the received signal. This greatly improves the strong signal handling capability of the mixer. By means of the arrangement herein described, the oscillator output signal can be varied over a range up to 1.5 volts or more, and as previously indicated this improves the signal handling capability of the mixer by some 15 to 20 db.

While the invention has been illustrated and described with reference to a preferred embodiment, it will be understood that the invention is not limited thereto but contemplates such modifications and further embodiments as may occur to those skilled in the art.

I claim:

1. In a receiver for signals transmitted at radio frequencies, a mixer to which a received signal is supplied, an oscillator which supplies an oscillatory signal to said mixer to effect frequency conversion of the received signal, and control means coupled to said oscillator and responsive to the amplitude of the received signal for varying the amplitude of said oscillatory signal in direct relation to the variations in said amplitude of the received signal.

2. A signal receiver according to claim 1, wherein said oscillator includes a tank circuit, and said control means varies the amplitude of said oscillatory signal by variably loading said tank circuit in inverse relation to the amplitude of the received signal.

3. A signal receiver according to claim 2, wherein said control means includes a transistor, and the loading of said tank circuit is varied by varying the degree of conductivity of said transistor.

4. A signal receiver according to claim 1, additionally comprising means for producing an AGC voltage having a magnitude dependent on the amplitude of said received signal, said control means comprising means responsive to said AGC voltage to control said oscillator so as to vary the amplitude of the oscillatory signal in response to said magnitude of said AGC voltage.

5. A signal receiver according to claim 4, wherein said oscillator includes a tank circuit, and said control means is connected to said tank circuit to vary the loading thereof in inverse relation to variations in the amplitude of the received signal.

6. A signal receiver according to claim 5, wherein said control means comprises a transistor whose conductivity is varied by said AGC voltage, and the loading of said tank circuit is varied by varying the degree of conductivity of said transistor.

7. A signal receiver according to claim 4, including a detector and AGC stage from which said AGC voltage is derived.

References Cited

UNITED STATES PATENTS 2,367,923 1/1945 Booth -------------- 325—408

KATHLEEN H. CLAFFY, Primary Examiner

CHARLES JIRAUCH, Assistant Examiner